United States Patent [19]

Hopkins

[11] Patent Number: 5,182,524
[45] Date of Patent: Jan. 26, 1993

[54] METHOD AND APPARATUS FOR STABILIZING PULSED MICROWAVE AMPLIFIERS

[75] Inventor: Donald B. Hopkins, Sacramento, Calif.

[73] Assignee: The Regents of the University of Calif., Oakland, Calif.

[21] Appl. No.: 850,456

[22] Filed: Mar. 10, 1992

[51] Int. Cl.⁵ ............................................... H03F 1/32
[52] U.S. Cl. ................................... 330/149; 330/129; 330/136; 330/279; 455/126
[58] Field of Search ............... 330/129, 136, 141, 149, 330/279, 281, 44–46; 375/60; 455/116, 126, 127

[56] References Cited

U.S. PATENT DOCUMENTS 5,128,629 7/1992 Trinh .................................. 330/281

Primary Examiner—James B. Mullins
Attorney, Agent, or Firm—Paul R. Martin; Kathleen S. Moss; Pepi Ross

[57] ABSTRACT

Phase and amplitude variations at the output of a high power pulsed microwave amplifier arising from instabilities of the driving electron beam are suppressed with a feed-forward system that can stabilize pulses which are too brief for regulation by conventional feedback techniques. Such variations tend to be similar during successive pulses. The variations are detected during each pulse by comparing the amplifier output with the low power input signal to obtain phase and amplitude error signals. This enables storage of phase and amplitude correction signals which are used to make compensating changes in the low power input signal during the following amplifier output pulse which suppress the variations. In the preferred form of the invention, successive increments of the correction signals for each pulse are stored in separate channels of a multi-channel storage. Sequential readout of the increments during the next pulse provides variable control voltages to a voltage controlled phase shifter and voltage controlled amplitude modulator in the amplifier input signal path.

21 Claims, 4 Drawing Sheets

METHOD AND APPARATUS FOR STABILIZING PULSED MICROWAVE AMPLIFIERS

BACKGROUND OF THE INVENTION

This invention was made under Contract No. DE-AC03-76SF00098 between the U.S. Department of Energy and the University of California for the operation of Lawrence Berkeley Laboratory. The Government has certain rights in this invention.

TECHNICAL FIELD

This invention relates to the generation of microwave energy and more particularly to a method and apparatus for stabilizing certain output parameters, such as phase and/or amplitude, of high power pulsed microwave amplifiers.

Devices for producing periodic pulses of microwave energy at very high peak power levels typically include a pulsed microwave amplifier which amplifies a signal produced by a low power microwave generator. The energy required for signal amplification is derived from a high energy electron beam that is directed into the amplifier. Klystrons, relativistic klystrons, free electron lasers and cyclotron auto-resonant masers are examples of pulsed microwave amplifiers of this kind.

Amplitude and phase stability at the output of pulsed microwave amplifiers of this kind is strongly dependent on the stability of the driving electron beam. Variations in electron beam energy can cause the phase of the microwave output energy to vary during the course of a pulse. Variations in beam current may produce amplitude fluctuations in the high power microwave output during an output pulse.

Electron beam sources of the kind that are best suited for very high power amplifiers, such as linear induction accelerators for example, tend to exhibit pronounced beam energy and current fluctuations. These have been observed to produce phase variations of as much as plus or minus 20° to 30° at the amplifier output and amplitude fluctuations of 20% or more.

The fluctuations are tolerable in some installations that require a very high power source of microwave energy such as in fusion plasma heating installations, for example. Greater stability is needed in other usages of such apparatus. The microwave power source for some types of charged particle accelerator, for example, must maintain a phase stability that is within the range of about plus or minus 2° and amplitude fluctuation should be less than plus or minus 1%, at least during the flat portion of the pulse top.

Conventional feedback techniques can be used to stabilize the output of high power pulsed microwave sources during each pulse in instances where the duration of each pulse is greater than about 0.1 microsecond. However, some recently developed pulsed microwave amplifiers of the previously identified kinds typically operate with pulse durations of only a few tens of nanoseconds. These devices frequently have physical sizes and resulting long signal paths that make it impractical, if not impossible, to stabilize output with conventional feedback techniques and systems.

The present invention is directed to overcoming one or more of the problems discussed above.

SUMMARY OF THE INVENTION

In one aspect, the invention is directed to a method for stabilizing the output of an electron beam driven pulsed microwave amplifier of the type having an input for receiving a low power microwave signal that is to be amplified and an output for delivering periodic output pulses of amplified microwave energy to a load. A characteristic of the microwave energy that is to be stabilized is sensed at the low power microwave signal to produce a reference signal that is indicative of the characteristic. The same characteristic is sensed in the the output pulses of the amplifier to produce a sequence of output signals. The output signals and reference signals are compared to produce a sequence of error signals that are indicative of variations of the characteristic at the amplifier output during individual ones of the output pulses. The error signals are used to produce and store a correction signal during each of the sequence of output pulses. The correction signals which were stored during prior output pulses are used to modify the low power microwave input signal during subsequent output pulses to suppress the variations during the subsequent output pulses.

In another aspect of the invention, the characteristic of the low power input signal and the amplifier output pulses which is sensed is the phase of the signal and the output pulses. Each stored correction signal is used to control the phase of the low power microwave signal during the subsequent pulse to maintain the phase of each amplifier output pulse substantially constant during the course of the pulse.

In another aspect of the invention, the characteristic of the low power input signal and the amplifier output pulses that is sensed is the amplitudes of the signal and pulses. Each of the correction signals is used to control the amplitude of the low power microwave signal during production of the subsequent amplifier output pulse to maintain the amplitude of the output pulse substantially constant.

In another aspect of the invention, the invention provides apparatus for stabilizing the output of an electron beam driven pulsed microwave amplifier of the type having an input for receiving a low power microwave signal that is to be amplified and an output for delivering periodic output pulses of amplified microwave energy to a load. First sensing means detect at least one characteristic of the low power signal to produce a reference signal and second sensing means detect the characteristic in the amplifier output pulses to produce output signals that are indicative of the characteristic at the amplifier output. The apparatus further includes means for comparing the output signals with the reference signal to produce a sequence of error signals that are indicative of variations of the characteristic at the amplifier output during individual ones of the output pulses. Additional means store a correction signal that includes the error signal during each amplifier output pulse and use the correction signals that were stored during prior output pulses to modify the characteristic in the low power microwave input signal during subsequent output pulses to suppress the variations in the subsequent output pulses.

In another aspect, the invention provides apparatus for suppressing phase variations at the output of a pulsed microwave amplifier during individual output pulses. The pulsed microwave amplifier is of the electron beam driven type and has an input which receives a low power microwave signal that is to be amplified. A voltage controlled phase shifter is coupled into the low power microwave signal path. A phase difference detector has a first input coupled to the low power microwave signal path and a second input coupled to the amplifier output. A pair of outputs of the phase difference detector exhibit a voltage difference that is a function of the degree of phase error at the amplifier output. A phase correction signal storage is coupled to the phase difference detector and has means for storing a plurality of momentary values during the course of each pulsed amplifier output pulse. The momentary values are indicative of the value of the voltage difference at successive different times in the course of the output pulse combined with the momentary value that was stored at the corresponding time during a preceding output pulse. Further components include means for sequentially reading out the previously stored momentary values during each output pulse in the form of a series of voltage levels which jointly provide the control voltage for the voltage controlled variable phase shifter.

In still another aspect, the invention provides apparatus for suppressing amplitude variations at the output of a pulsed microwave amplifier during individual output pulses. The amplifier is of the electron beam driven type and has an input at which a low power microwave input signal is received from a microwave generator. A voltage controlled amplitude modulator is coupled into the input signal path. An amplitude difference detector has a first input coupled to the input signal path and a second input coupled to the output of the amplifier and has a pair of outputs which exhibit a voltage difference that is a function of the degree of amplitude error at the amplifier output relative to the input signal. An amplitude correction signal storage is coupled to the amplitude difference detector and has means for storing a plurality of momentary values during the course of each amplifier output pulse. The momentary values are indicative of the value of the voltage difference at successive different times in the course of the output pulse combined with the momentary value that was stored at the corresponding time during a preceding pulse. Further components include means for sequentially reading out the previously stored momentary values during each output pulse in the form of a series of successive voltage levels which jointly provide the control voltage for the voltage controlled variable amplitude modulator.

The invention suppresses phase and/or amplitude variations at the output of an electron beam driven pulsed microwave amplifier during each individual pulse including in instances where brevity of the pulses prohibits stabilization by traditional feedback techniques. Phase and amplitude variations at the amplifier output that are caused by electron beam instability tend to be repetitive from pulse to pulse, i.e. the degree and timing of the variations tend to be same during successive pulses. This enables the invention to suppress such variations in succeeding pulses by using stored error signals derived from detection of the variations during preceding pulses. Pulse error compensation during extremely brief pulses is made possible since the data needed for the compensation is pre-existing at the start of each pulse.

The invention, together with further aspects and advantages thereof, may be further understood by reference to the following description of the preferred embodiment and by reference to the accompanying drawings.

DETAILED DESCRIPTION OF THE PREFERRED EMBODIMENT

Figure 1:
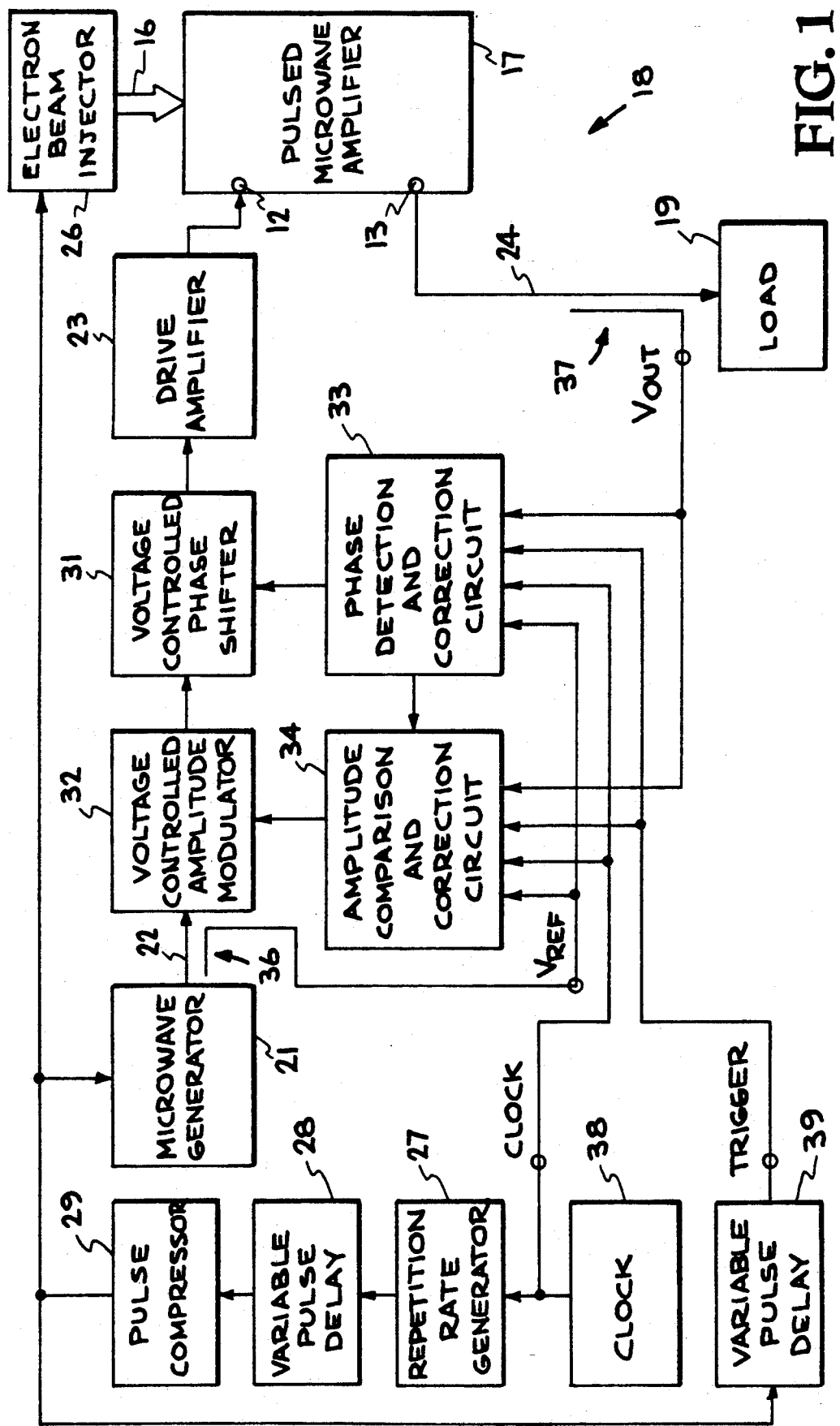
FIG. 1 is a schematic block diagram depicting components of a high power pulsed microwave source which includes a phase and amplitude stabilizing system in accordance with a preferred embodiment of the invention.

Referring initially to FIG. 1 of the drawings, the invention may be used to stabilize the output of pulsed microwave amplifiers 17 of any of the known types which have an input 12 for receiving a low power microwave signal that is to be amplified, an output 13 for delivering periodic pulses of amplified microwave energy and in which the energy required for amplification is derived from a high energy electron beam 16 that is injected into the amplifier or generated within the amplifier. Pulsed microwave amplifiers 17 of this kind are a component of a high power microwave source 18 which may supply microwave energy to any of a variety of loads 19, the load being a charged particle accelerator in this particular example of the invention.

In installations of this type, the low power microwave signal originates at a microwave generator 21 and is transmitted to amplifier input 12 through a signal path 22 which includes a preamplifier 23 which may be a traveling wave tube amplifier for example. Signal path 22 is defined by coaxial cables or waveguides. An output coaxial cable or waveguide 24 couples the pulsed microwave amplifier 17 with the load 19 to transmit the amplified pulses to the load. Microwave generator 21 and the amplifier electron beam injector 26 are periodically actuated by trigger pulses which are produced by a pulse repetition rate generator 27. Repetition rate generator 27 is coupled to the microwave generator Z1 and electron beam injector 26 through a variable pulse delay 28, which enables adjustment of the timing of the pulsed microwave amplifier 17 output pulses and through a pulse compressor 29 which enables production of extremely brief output pulses.

The above described components, pulsed microwave amplifier 17, microwave generator 21, preamplifier 23, electron beam injector 26, repetition rate generator 27, pulse delay 28 and pulse compressor 29 may each be of conventional design and, in the absence of further components to be hereinafter described, can be operated in the known manner as an unstabilized microwave source. In one particular existing system of this kind, which is located at the ARC facility of the Lawrence Livermore National Laboratory, California, the pulse microwave amplifier 17 is a relativistic klystron which operates at a frequency of 11.4 GHz with a pulse width or duration of 50 nanoseconds, the electron beam having a typical magnitude of about 800 amperes and an injection energy of about 1.3 million electron volts. The system can produce over 300 MW of peak power. For purposes of example, components of the present invention will be described as having specific parameters that are compatible with this system but such parameters should not be taken to be limitative of the scope of the invention as other parameters are appropriate in other usages of the invention.

Components for phase and amplitude stabilization of the amplifier output pulses in accordance with the invention include a variable phase shifter 31 and a variable microwave amplitude modulator 32 in signal path 22 which components are coupled into the signal path between microwave generator 21 and preamplifier 23. The phase shifter 31 is of the known voltage controlled form which produces a degree of phase shift that is a function of the magnitude of a control voltage that is applied to the device and should have a very fast response to changes in the control voltage. Varactor (variable reactance) diode phase shifters which function essentially as a variable capacitance in shunt connection across the signal path have fast response times suitable for the purpose. Amplitude modulator 32 is also voltage controlled and may be of a PIN diode or other controllable type.

Control voltage for phase shifter 31 is provided by a phase detection and correction circuit 33 and control voltage for modulator 32 is provided by an amplitude comparison and correction circuit 34 which circuits will hereinafter be described in more detail. The phase detection and correction circuit 33 compares the phase of each output pulse of the pulsed microwave amplifier 17 with the phase of the low power microwave signal from generator 21 to detect any phase variations or phase errors in the amplifier output that occur during the course of the pulse. Circuit 33 stores this information until the following output pulse commences and then directs a control voltage to phase shifter 31 during the following pulse which produces phase variations at the input 12 of amplifier 17 that suppress repetition of the phase error at the amplifier output during the following pulse.

The amplitude comparison and correction circuit 34 functions in an essentially similar manner. Circuit 34 compares the amplitude of each amplifier 17 output pulse with the amplitude of the low power microwave signal to detect any amplitude variations or errors in the amplifier output during the course of the pulse. This information is stored until the following pulse begins and enables circuit 34 to deliver a control voltage to modulator 32 during the following pulse which suppresses a repetition of the amplitude variations during the following pulse.

A first directional coupler 36 at signal path 22, between microwave generator 21 and modulator 32, provides circuits 33 and 34 with a reference signal $V_{ref}$ which is indicative of the phase and amplitude of the microwave generator output. A second directional coupler 37 at the amplifier output waveguide 24 provides the circuits 33 and 34 with another signal $V_{out}$ that is indicative of the phase and amplitude of the amplifier output pulses. For reasons which will hereinafter be described, circuits 33 and 34 also receive cyclic clock pulses having a frequency sufficiently high to provide a plurality of clock pulses during each amplifier 17 output pulse. These are provided by a clock pulse generator 38 having a frequency of 90 MHz in this particular example of the invention. Clock pulse generator 38 also provides the clock signal for the pulse repetition rate generator 27. The trigger signal which actuates microwave generator 21 and electron beam injector 26 at the start of each amplifier 17 output pulse is also provided to circuits 33 and 34 through a variable pulse delay 39 which enables adjustment of the timing of operations within circuits 33 and 34 during production of the output pulses as will hereinafter be further discussed.

Figure 2:
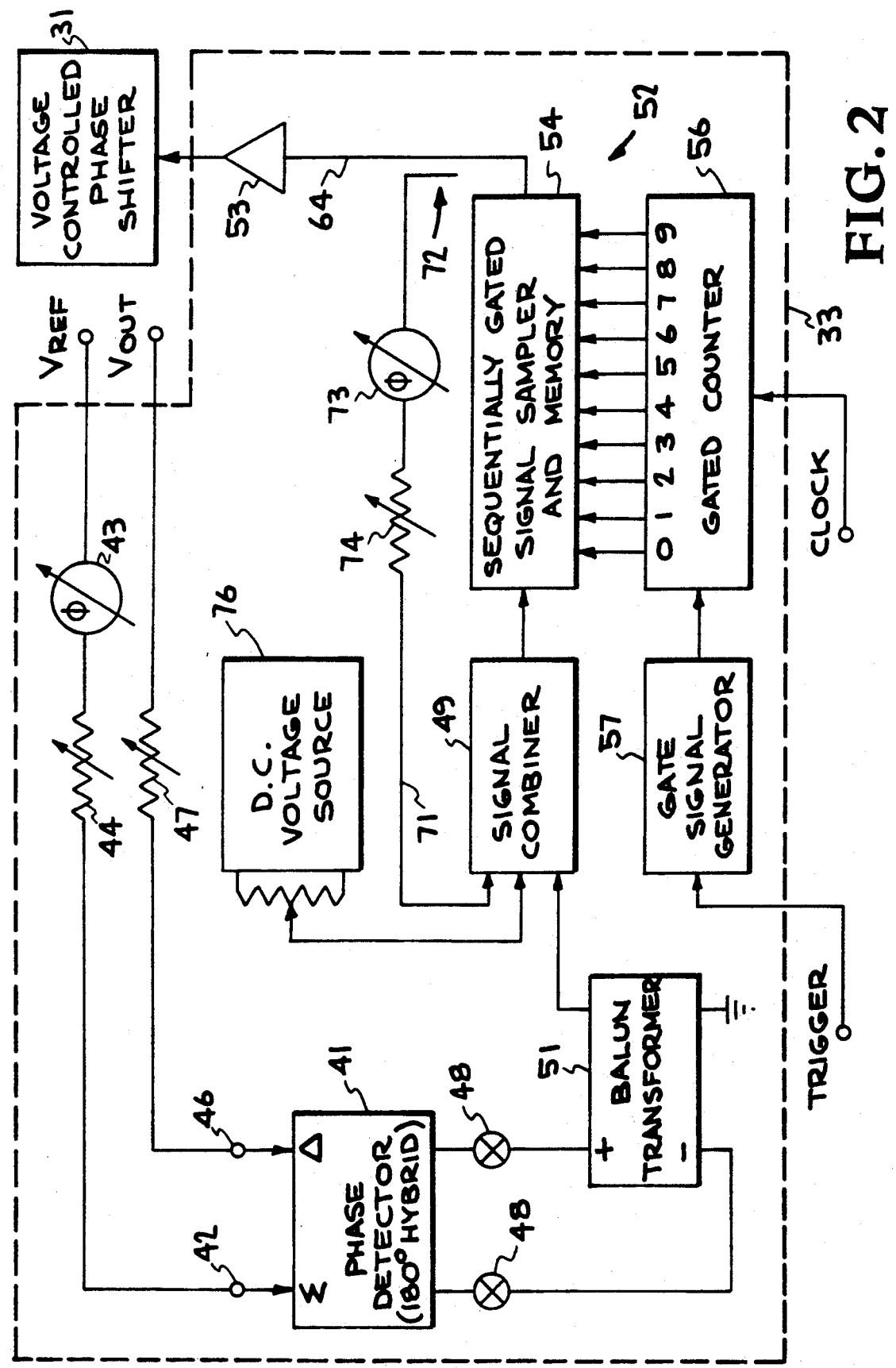
FIG. 2 is a circuit diagram showing a phase detection and correction circuit of the system in greater detail.

Referring now to FIG. 2, suitable components for the phase detection and correction circuit 33 include a phase detector 41 which may be of the 180° hybrid type. The $V_{ref}$ signal is transmitted to a first input 42 of phase detector 41 through a variable phase shifter 43 and variable attenuator 44. The $V_{out}$ signal is received at at the other input 46 of phase detector 41 through another attenuator 47. The variable attenuators 44 and 47 enable adjustment of the signal levels that are applied to phase detector inputs 42 and 46. A pair of matched crystal detectors 48 form the output of phase detector 41 and exhibit voltage differences during the course of an amplifier 17 output pulse that define the envelope of the instantaneous phase errors at the amplifier output. Phase shifter 43 is adjusted to cause the output of phase detector 41 to be zero when there is no phase error in the amplifier 17 output.

The phase error signals from phase detector 41 are transmitted to a signal combiner 49 through an RF transformer 51 which is of the balun (balanced to unbalanced) type having an ungrounded primary side and a ground at one end of the secondary side. Use of two crystal detectors 48 and a balun transformer 51 suppresses amplitude dependence and minimizes coupling between the two inputs.

Signal combiner 49 is a summing junction which combines each phase error pulse from transformer 51 with a feedback signal pulse to construct a correction signal and which transmits the correction signal to signal storing means 52. The feedback signal is the correction signal that was stored during the preceding amplifier 17 output pulse. The previously stored correction signal is also and amplified by a signal amplifier 53 and is then applied to the previously described voltage controlled phase shifter 31 as a control voltage for the phase shifter. This causes phase shifter 31 to vary the phase of the low voltage microwave signal at the input of the pulsed microwave amplifier 17 in a manner which suppresses phase variations at the output of the amplifier during the course of each pulse.

As the phase errors which are being compensated for tend to be repetitive during successive amplifier 17 output pulses, progressively smaller phase errors are detected during an initial sequence of amplifier output pulses. The system then settles down to a near steady state operation in which the correction signal that is entered into storing means 52 through signal combiner 49 during each amplifier 17 output pulse is predominately the previously stored correction signal that is fed back from the output of the storing means. Small irregular pulse to pulse variations in the electron beam will cause the system to continue to make small phase corrections as required.

The storing means 52 can be of the digital form provided that extremely fast analog to digital and digital to analog convertors and the like are utilized. In this example, the storing means 52 is an analog type which stores each correction signal in the form of a sequence of different voltage levels that can be sequentially read out during the course of each amplifier 17 output pulse to provide the voltage control signal to phase shifter 31. In the present embodiment, the storing means 52 includes a multi-channel sequentially gated signal sampler and memory 54 which is controlled by a gated counter 56.

Counter 56 is actuated at the beginning of each amplifier 17 output pulse by a gate pulse generator 57 in response to the previously described delayed trigger signal.

Figure 3:
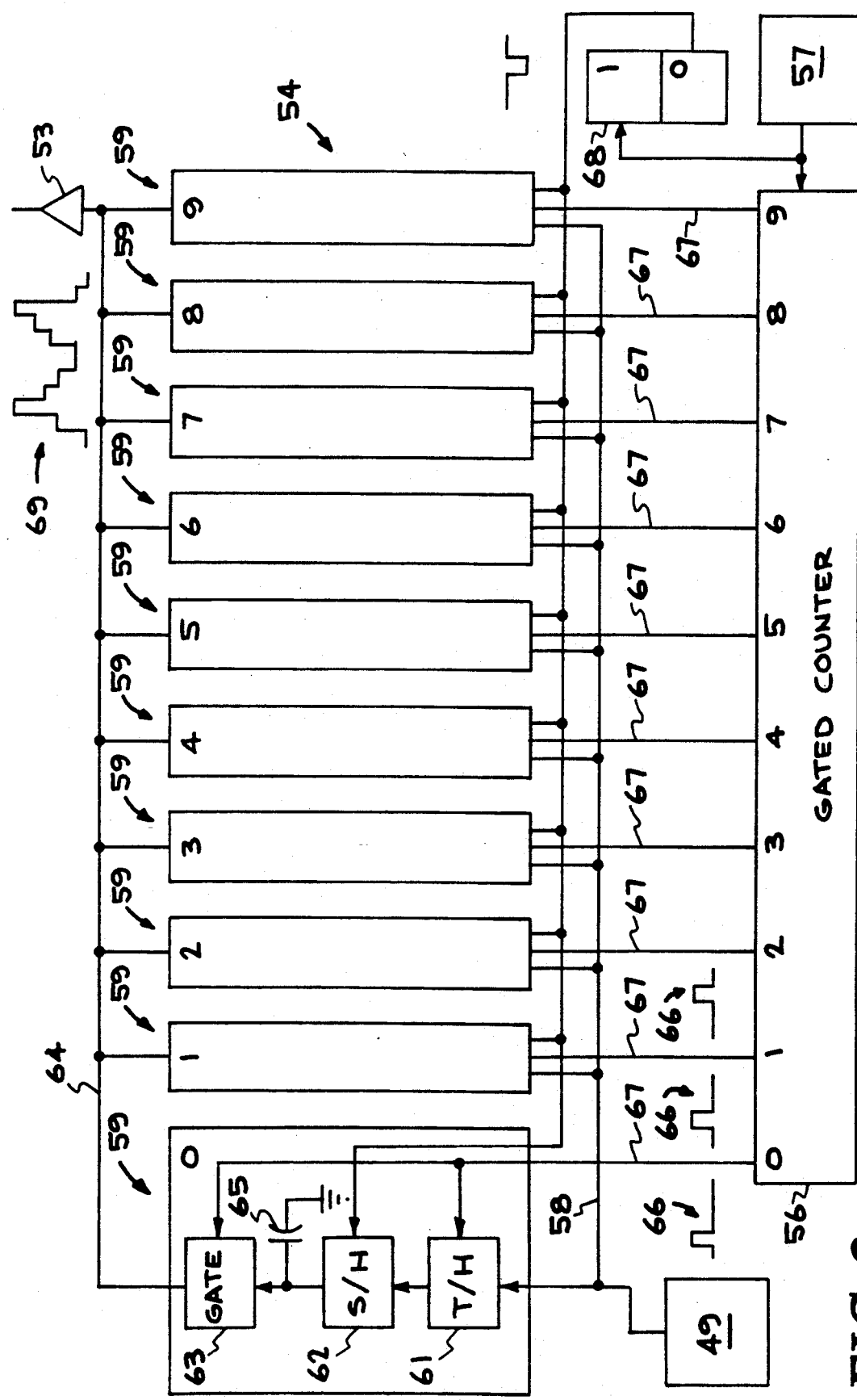
FIG. 3 is a circuit diagram depicting phase correction signal processing components of FIG. 2 in greater detail.

More particularly and with reference to FIG. 3, the signal sampler and memory 54 has an input conductor 58 which receives each correction signal voltage pulse from signal combiner 49 and which transmits the pulse to each of a plurality of identical signal processing channels 59. There are ten such channels 59 in this embodiment of the invention, identified by numerals 0 to 9 in FIG. 3 in which the first or 0 channel is shown in greater detail. Each such channel 59 has a track and hold module 61 of the known type. Such modules are a gated buffer amplifier having an output voltage that follows the input voltage during the gate period and which holds the voltage that exists at the end of the gate period as a D.C. signal. Within each channel 59, the track and hold module 61 is connected to a sample and hold module 62 of the known type that receives and stores the output voltage from the track and hold module at the end of each amplifier 17 output pulse. The stored voltage is held by a capacitor 65 with an integrating time constant of 10 microseconds in this example. This enables the track and hold module to acquire a new signal during the subsequent pulse. Each channel 59 also has a gate 63 which gates out the voltage that is stored by the capacitor 65 to a readout conductor 64 that is common to all channels and which connects with the input of the previously described control voltage signal amplifier 53.

During each amplifier 17 output pulse and in response to the previously described trigger signal, gate signal generator 57 transmits a succession of gate pulses to gated counter 56, the number of such gate pulses in the sequence being equal to the number of channels 59 and thus being ten in the present example. This causes a sequence of ten gate pulses 66 to be generated at equal intervals during the course of the amplifier 17 output pulse which gate pulses appear on successive individual ones of the ten outputs 67 of the gated counter 56. Outputs 67 are each connected to the corresponding one of the channels 59 of signal sampler and memory 54 and transmit the gate pulses 66 to the track and hold module 61 and gate 63 of the associated channel 59.

The initial gate pulse 66 causes the track and hold module 61 of the first or zero channel 59 to sample the initial portion of the current correction signal from signal combiner 49 and to hold a voltage corresponding to the average voltage of the correction signal during that interval. Successive ones of the gate pulses similarly cause successive ones of the channels 59 to track and hold voltages corresponding to the average value of successive additional portions of the correction signal.

Track and hold modules 61 are capable of very high speed signal acquisition but their output voltage may drop by an undesirable amount during extended hold periods between successive amplifier output pulses which may typically be a large fraction of a second. Sample and hold modules 62 require more time to acquire a signal value but can maintain their D.C. output voltage indefinitely. Accuracy of the stored values is assured by the transfer of the voltage values to the sample and hold modules 62 after acquisition of the values by the track and hold modules 61.

To effect the transfer of the voltage values, the trigger signal which initiates the sampling process at the start of each amplifier output pulse also triggers a monostable multivibrator 68 which provides a pulse delay of 100 ns after which the complementary output of the multivibrator triggers the sample and hold modules of all channels to acquire and store the voltage values that were stored by the track and hold modules 61 during the amplifier output pulse.

The outputs 67 of gated counter 56 trigger the gate 63 of each memory channel 59 at the same time that the track and hold module 61 of the channel is triggered. After the initial correction signal, this causes the previously stored voltages to be sequentially gated out to readout conductor 64 from the sample and hold modules 62 at the same time that the track and hold modules 61 are storing new values from the current correction signal. The capacitors 65 are, in effect, intermediate signal storages which enable readout of voltage values derived from the previous amplifier output pulse while values from the current pulse are being acquired. The value which is being gated out is not affected by the value which is concurrently being acquired.

The sequence 69 of voltages that are read out in this manner approximates the correction signal that was developed during the previous pulsed microwave amplifier 17 output pulse. Sequence 69 is amplified by signal amplifier 53 and becomes the control voltage for the variable phase shifter 31 (FIGS. 1 and 2) as previously described.

In the circuit depicted in FIG. 3, each output pulse 66 of gated counter 56 terminates at the same time that the next output pulse 66 begins. In instances where this does not provide sufficient time for the track and hold modules 61 to acquire and hold a voltage value, the gated counter 56 may of a type which produces longer output pulses that overlap in time.

In some instances the correction signal sampling period that is established by gated counter 56, 56 nanoseconds in this example, may be shorter than the electron beam pulse period at the pulsed microwave amplifier 17 of FIG. 1. With continued reference to FIG. 1, the variable pulse delay 39 enables centering of the correction signal sampling period on the electron beam pulse period.

Referring again to FIG. 2, the feedback signal path 71 through which the correction signals on readout transmission line 64 are fed back to signal combiner 49 includes a signal sampler such as a directional coupler 72 at line 64, a variable phase shifter 73 and a variable attenuator 74. The phase shifter 73 and attenuator 74 enable adjustments to match the parameters of the feedback signal with the error signal. An intermediate level of control voltage is applied to the voltage controlled phase shifter 31 when there is no error at the pulsed microwave amplifier output to enable the phase shifter to correct both phase lag errors and phase lead errors depending on the direction of a change in the control voltage away from the intermediate value. An adjustable D.C. voltage source 76 provides this bias voltage in the feedback signal through the signal combiner 49.

Figure 4:
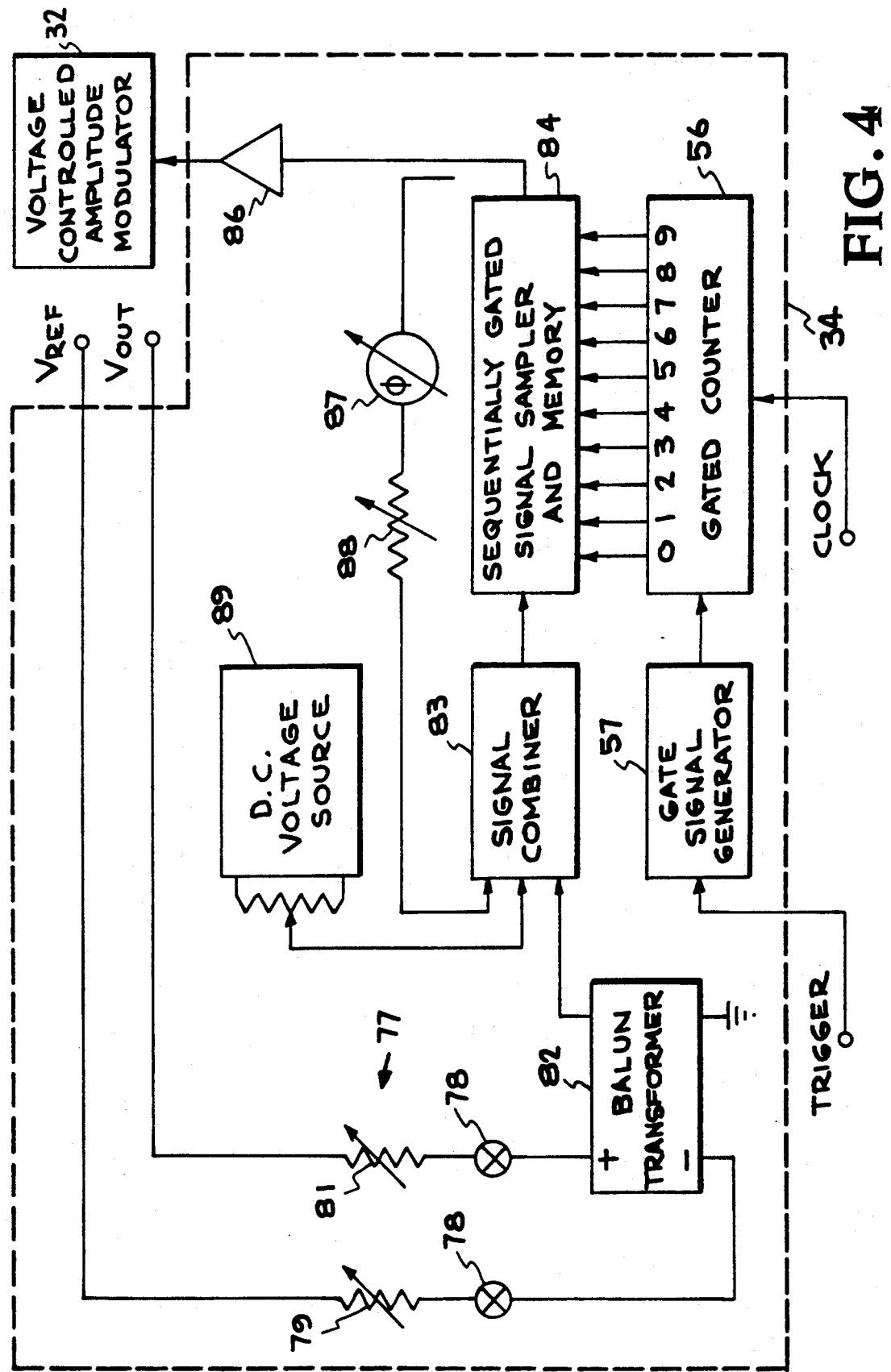
FIG. 4 is a circuit diagram showing the amplitude comparison and correction circuit of FIG. 1 in greater detail.

Referring now to FIG. 4, the amplitude comparison and correction circuit 34 includes means 77 for comparing the instantaneous amplitudes of the $V_{ref}$ and $V_{out}$ signals during each pulsed microwave amplifier output pulse to produce an error signal pulse that corresponds to variations of the output amplitude in the course of the pulse. In this embodiment, such means 77 includes another pair of matched crystal detectors 78 one of which receives the $V_{ref}$ signal through a first variable attenuator 79 and the other of which receives the $V_{out}$ signal through a second variable attenuator 81. Attenuators 79 and 81 enable an adjustment to equalize the amplitudes of the two signals at the crystal detectors 78 when the output amplitude of the pulsed microwave amplifier 17 has the desired value at which it is to be stabilized.

Any variation in the amplitude of the pulsed microwave amplifier output during the course of a pulse causes the crystal detectors 78 to output a voltage difference which is a function of the magnitude of the variation and which has a polarity indicative of the direction of the variation. This voltage difference is transmitted to the unbalanced side of another balun RF transformer 82. The amplitude error signal which appears at the balanced side of transformer 82 is transmitted to another signal combiner or summing junction 83 which transmits a correction signal voltage pulse to another multi-channel, sequentially gated signal sampler and memory 84.

As in the previously described phase detection and correction circuit, the correction signal which was stored in signal sampler and memory 84 during the prior pulsed microwave amplifier 17 output pulse is read out and reconstructed during the next output pulse and is amplified by a signal amplifier 86. The output voltage from signal amplifier 86 is the control voltage for the amplitude modulator 32 which varies the low power microwave signal at the input of the pulsed microwave amplifier 17 as necessary to maintain the amplitude at the output substantially constant. The signal sampler and memory 84 may be similar to the corresponding component of circuit 33 which was previously described in more detail and is controlled by the gate signal generator 57 and gated counter 56 in the manner previously described. Also, as in the previously described phase detection and correction circuit, the previously stored correction signal that is read out of signal sampler and memory 84 is fed back to the signal combiner 83 through a variable phase shifter 87 and variable attenuator 88 for combination with the amplitude error signal that is currently being generated. An adjustable D.C. voltage source 89 may be used to provide a bias voltage in the stored amplitude correction signal to equalize the response of the voltage controlled amplitude modulator 32 to amplitude increases and decreases in instances where it is otherwise out of balance.

Referring again to FIG. 1, the embodiment of the invention which has been herein described includes components for stabilizing both the phase and amplitude of a pulsed microwave amplifier 17 output. The system may used to stabilize phase only by omitting the amplitude comparison and correction circuit 33 or the phase detection and comparison circuit 33 may be omitted if only amplitude stabilization is needed.

While the invention has been described with respect to a particular embodiment for purposes of example, many variations and modifications of the method and apparatus are possible and it is not intended to limit the invention except as defined by the following claims.

What is claimed is:

1. In a method for stabilizing the output of an electron beam driven pulsed microwave amplifier which has a microwave signal input for receiving a low power microwave signal that is to be amplified and which has an output for delivering periodic output pulses of amplified microwave energy to a load, the steps comprising:

sensing at least one characteristic of said low power microwave signal to produce a reference signal that is indicative of said characteristic, sensing said characteristic in said amplifier output pulses during each of a sequence of output pulses to produce a sequence of output signals that are indicative of said characteristic in said output pulses, comparing each of said output signals with the reference signal to produce a sequence of error signals that are indicative of variations of said characteristic at said pulsed microwave amplifier output during individual ones of said output pulses, utilizing said error signals to produce and store a correction signal during each of said sequence of output pulses, utilizing the correction signals which were stored during prior output pulses to modify said characteristic in said low power microwave signal during subsequent output pulses to suppress said variations during said subsequent output pulses.

2. The method of claim 1 wherein said characteristic of said low power microwave signal and said output pulses that is sensed is the phase of said signal and said pulses and wherein the step of utilizing the correction signals includes the further step of using each of said stored correction signals to control the phase of said low power microwave signal during production of the subsequent amplifier output pulse to maintain the phase of each amplifier output pulse substantially constant during the course of the amplifier output pulse.

3. The method of claim 1 wherein said characteristic of said low power microwave signal and said output pulses that is sensed is the amplitude of said signal and said pulses and wherein the step of utilizing the correction signals includes the further step of using each of said stored correction signals to control the amplitude of said low power microwave signal during production of the subsequent amplifier output pulse to maintain the amplitude of each amplifier output pulse substantially constant during course of the amplifier output pulse.

4. The method of claim 1 wherein characteristics of said low power microwave signal and said output pulses that are sensed include both phase and amplitude and wherein further includes the step of storing first and second sequences of said correction signals and using said sequences to suppress variations of both phase and amplitude at said pulsed microwave amplifier output during said subsequent pulses.

5. The method of claim 1 wherein the storing of each of said correction signals is achieved by sampling the momentary value of the correction signal at a plurality of successive times during production of an amplifier output pulse and by separately storing each of said momentary values, and wherein the correction signal is reconstructed during the subsequent pulse by sequentially reading out said stored momentary values.

6. The method of claim 5 wherein production of said correction signal during each of said amplifier output pulses includes the step of combining the values of said error signal at said successive times with the momentary values of the correction signal that were stored at corresponding times during the prior output pulse.

7. The method of claim 6 wherein production of said correction signal includes the further step of combining a constant bias value with said momentary values of said error signal and said momentary values of the previously stored correction signal.

8. Apparatus for stabilizing the output of an electron beam driven pulsed microwave amplifier which has an input for receiving a low power microwave signal that is to be amplified and an output for delivering periodic output pulses of amplified microwave energy to a load, said low power microwave signal being produced by a low power microwave generator and wherein means for transmitting microwave signals couples said generator to said input of said pulsed microwave amplifier, wherein the improvement comprises:

first sensing means for sensing at least one characteristic of said low power microwave signal and which produces a reference signal that is indicative of said characteristic, second sensing means for sensing said characteristic in said amplifier output pulses and which produces output signals that are indicative of said characteristic in said amplifier output pulses, comparing means for comparing each of said output signals with said reference signal to produce a sequence of error signals that are indicative of variations of said characteristic at said pulsed microwave amplifier output during individual ones of said amplifier output pulses, means for storing a correction signal that includes said error signal during each of said sequence of said amplifier output pulses, and means for utilizing the correction signals which were stored during prior amplifier output pulses to modify said characteristic in said low power microwave signal during subsequent output pulses to suppress said variations during said subsequent output pulses.

9. The apparatus of claim 8 wherein said comparing means includes a phase detector and said error signals are indicative of phase fluctuations at said output of said pulsed microwave amplifier, and wherein said means for modifying said characteristic in said low power microwave signal includes a variable phase shifter through which said low power microwave signal is transmitted to said input of said pulsed microwave amplifier and acts to suppress said phase fluctuations by making compensating phase adjustments in said low power microwave signal.

10. The apparatus of claim 8 wherein said comparing means compares the amplitudes of said reference signal and said output signals and wherein said error signals are indicative of amplitude fluctuations at said output of said pulsed microwave amplifier, and wherein said means for modifying said characteristic in said low power microwave signal includes an amplitude modulator through which said low power microwave signal is transmitted to said input of said pulsed microwave amplifier and acts to suppress said amplitude fluctuations by making compensating amplitude adjustments in said low power microwave signal.

11. The apparatus of claim 10 wherein said comparing means includes a phase detector and produces additional error signals that are indicative of phase fluctuations at said output of said pulsed microwave amplifier and wherein said means for modifying said characteristic in said low power microwave signal further includes a variable phase shifter through which said low power microwave signal is transmitted to said input of said pulsed microwave amplifier and acts to suppress said phase fluctuations by making compensating phase adjustments in said low power microwave signal.

12. The apparatus of claim 8 wherein said correction signal storing means separately stores the momentary value of the correction signal at each of a plurality of successive times during production of an amplifier output pulse and reconstructs the correction signal during production of the subsequent amplifier output pulse by sequentially reading out said stored momentary values.

13. The apparatus of claim 12 further including feedback means for combining the current momentary value of said error signal with the momentary value of said correction signal that was stored at the corresponding time in the previous amplifier output pulse and wherein said correction signal storing means stores the combined values at each of said successive times.

14. The apparatus of claim 13 wherein said comparing means produces each of said error signals in the form of a voltage pulse which varies in amplitude during the course of each the amplifier output pulse in accordance with said variations of said characteristic, and wherein said correction signal storing means includes a multi-channel sequentially gated sample and hold circuit which separately stores voltage levels corresponding to said combined momentary values at each of said plurality of successive times.

15. The apparatus of claim 14 wherein said means for modifying said characteristic in said low power microwave signal is responsive to a control voltage, further including means for providing said control voltage by sequentially reading out said voltage levels that are separately stored in said sample and hold circuit.

16. The apparatus of claim 8 further including a source of repetitive clock pulses and triggering means for cyclically actuating said pulsed microwave amplifier in response to each production of a predetermined number of said clock pulses and for deactuating said pulsed microwave amplifier a predetermined interval after each actuation thereof, and means for cyclically actuating said correction signal storing means in synchronism with said actuations of said pulsed microwave amplifier.

17. The apparatus of claim 16 wherein said means for cyclically actuating said correction signal storage means includes a pulse delay circuit connected between said triggering means and said correction signal storage means to delay said actuation of said correction signal storing means during an initial portion of each actuation of said pulsed microwave amplifier.

18. The apparatus of claim 8 further including a first signal amplitude modulator connected between said first sensing means and said comparing means and a second signal amplitude modulator connected between said second sensing means and said comparing means.

19. The apparatus of claim 8 wherein said comparing means has first and second outputs which exhibit a voltage difference that is indicative of said variation of said characteristic, further including a balun RF transformer connected between said comparing means and said signal storing means, said transformer having a balanced primary side coupled to said first and second outputs of said comparing means and having an unbalanced secondary side coupled to said correction signal storing means.

20. Apparatus for suppressing phase variations at the output of a pulsed microwave amplifier during individual output pulses, said pulsed microwave amplifier being of the electron beam driven type and having an input at which a low power microwave signal that is to be amplified is received from a microwave generator through a low power microwave signal path, comprising:
- a voltage controlled variable phase shifter coupled into said low power microwave signal path,
- a phase difference detector having a first input coupled to said low power microwave signal path and a second input coupled to said output of said pulsed microwave amplifier and having a pair of outputs which exhibit a voltage difference that is a function of the degree of phase error at said pulsed microwave amplifier output relative to said low power microwave signal.
- a phase correction signal storage coupled to said phase difference detector and having means for storing a plurality of momentary values during the course of each output pulse of said pulsed microwave amplifier which momentary values are indicative of the value of said voltage difference at successive different times in the course of said output pulse combined with the momentary value that was stored at the corresponding time during a preceding output pulse,
- for sequentially reading out the previously stored momentary values during each output pulse in the form of a series of successive voltage levels which jointly provide the control voltage for said voltage controlled variable phase shifter, and
- means for transmitting said control voltage to said voltage controlled phase shifter during each of said output pulses.

21. Apparatus for suppressing amplitude variations at the output of a pulsed microwave amplifier during individual output pulses, said pulsed microwave amplifier being of the electron beam driven type and having an input at which a low power microwave signal that is to be amplified is received from a microwave generator through a low power microwave signal path, comprising:
- a voltage controlled amplitude modulator coupled into said low power microwave signal path,
- an amplitude difference detector having a first input coupled to said low power microwave signal path and a second input coupled to said output of said pulsed microwave amplifier and having a pair of outputs which exhibit a voltage difference that is a function of the degree of amplitude error at said pulsed microwave amplifier output relative to said low power microwave signal,
- an amplitude correction signal storage coupled to said amplitude difference detector and having means for storing a plurality of momentary values during the course of each output pulse of said pulsed microwave amplifier which momentary values are indicative of the value of said voltage difference at successive different times in the course of said output pulse combined with momentary value that was stored at the corresponding time during a preceding output pulse,
- means for sequentially reading out the previously stored momentary values during each output pulse in the form of a series of successive voltage levels which jointly provide the control voltage for said voltage controlled variable signal attenuator, and
- means for transmitting said control voltage to said voltage controlled amplitude modulator during each of said output pulses.

* * * * *